United States Patent
Ozard

(10) Patent No.: US 9,461,596 B1
(45) Date of Patent: Oct. 4, 2016

(54) DOHERTY POWER AMPLIFIER WITH INTEGRATED PRE-DISTORTION

(71) Applicant: ANADIGICS, iNC., Warren, NJ (US)

(72) Inventor: Kenneth Sean Ozard, Middlesex, NJ (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/292,241

(22) Filed: May 30, 2014

Related U.S. Application Data

(60) Provisional application No. 61/829,703, filed on May 31, 2013.

(51) Int. Cl.
  H03F 3/68  (2006.01)
  H03F 1/32  (2006.01)
  H03G 1/00  (2006.01)

(52) U.S. Cl.
  CPC .............. *H03F 1/3247* (2013.01); *H03F 3/68* (2013.01); *H03G 1/0017* (2013.01); *H03F 2200/435* (2013.01); *H03F 2201/3231* (2013.01)

(58) Field of Classification Search
  CPC ........ H03F 5/00; H03F 3/45475; H03F 3/44; H03F 3/28; H03F 3/602; H03F 7/02; H03F 3/45085; H03F 3/26; H03F 1/14; H03F 3/21; H03F 2200/372; H03F 3/68; H03G 1/0023; H03G 1/00; H01L 2924/3011
  USPC ....... 330/3, 69, 74, 116, 117, 124, 134, 252, 330/254, 262, 275, 284, 292, 295, 301, 307, 330/124 R; 375/296–297; 455/114.3
  See application file for complete search history.

(56) References Cited

U.S. PATENT DOCUMENTS

| | | | |
|---|---|---|---|
| 7,064,606 B2 * | 6/2006 | Louis ................... | H03F 1/0266 330/124 R |
| 7,961,045 B2 * | 6/2011 | Morris ................. | H03F 1/0288 330/124 R |

(Continued)

OTHER PUBLICATIONS

"Power Amplifiers", by Timo Rahkonen, Department of Electrical Engineering and Infotech, University of Oulu, Finland, 2005, pp. 15.*

(Continued)

*Primary Examiner* — Steven J Mottola
*Assistant Examiner* — Hafizur Rahman
(74) *Attorney, Agent, or Firm* — Kelley Drye & Warren LLP

(57) ABSTRACT

The present invention implements a series of analog gain and phase correction circuits in each leg of the N-way Doherty to significantly reduce amplitude modulation to amplitude modulation (AM-AM) and amplitude modulation to phase modulation (AM-PM), distortion. The correction blocks comprise gain and phase corrections and optionally an additional gain block. The phase corrections include at least a phase offset and may include an optional non-linear element such as a diode pre-distorter. The pre-distortion circuitry is intended to reduce the necessary complexity of the DPD and reduce the DPD cost and power consumption. The gain and phase corrections can be calculated from computational optimization to minimize the AM-AM and AM-PM distortion. The gain and phase corrections can also be calculated from the AM-AM and AM-PM data which can be output from common DPD systems and laboratory characterization equipment.

20 Claims, 14 Drawing Sheets

(56) References Cited

U.S. PATENT DOCUMENTS

| | | | | |
|---|---|---|---|---|
| 8,154,339 B2* | 4/2012 | Zolghadri | ............ | H01P 5/12 330/124 R |
| 8,629,722 B2* | 1/2014 | Bowles | ............ | H03F 1/0261 330/124 R |
| 2011/0076974 A1* | 3/2011 | Jang | ............ | H04B 1/0475 455/188.1 |
| 2012/0154033 A1* | 6/2012 | Lozhkin | ............ | H03F 1/3247 330/124 R |
| 2012/0294387 A1* | 11/2012 | Ghannouchi | ............ | H03F 1/0288 375/295 |
| 2014/0125416 A1* | 5/2014 | Widdowson | ............ | H03F 1/3205 330/295 |

OTHER PUBLICATIONS

Yamanouchi et al., "Analysis and Design of a Dynamic Predistorter for WCDMA Handset Power Amplifiers", IEEE Transactions on Microwave Theory and Techniques, vol. 55, No. 3, Mar. 2007, pp. 493-503.*

* cited by examiner

DOHERTY POWER AMPLIFIER WITH INTEGRATED PRE-DISTORTION

This application claims benefit of provisional application Ser. No. 61/829,703, filed May 31, 2013, for "DOHERTY POWER AMPLIFIER WITH INTEGRATED PRE-DISTORTION," the contents of which are incorporated herein by reference.

BACKGROUND

Modern communication systems often employ high peak to average ratio (PAR) signals. Linear amplification of high PAR signals was classically achieved by using high back off with a linear amplifier at the cost of very low power added efficiency (PAE).

Doherty amplifiers offer a potential solution by offering improved PAE under back off. Thus, Doherty amplifiers can reduce system cost, size, weight and power consumption primarily as a result of the substantially improved power added efficiency. A typical Doherty power amplifier has a main amplifier and a peaking amplifier with an input of the main amplifier coupled to an input of the peaking amplifier by a quarter-wave transmission line. An output from the main amplifier is coupled to an output from the peaking amplifier by a second quarter-wave transmission line. At low amplitude inputs, only the main amplifier is operational. At higher amplitude inputs, the peaking amplifier is also on; and the quarter-wave delay in the input to the peaking amplifier matches the quarter-wave delay in the output of the main amplifier to the output of the peaking amplifier with the result that the output of the peaking amplifier is in phase with the output of the main amplifier. For further information on Doherty amplifiers, please see Thomas H. Lee, *Planar Microwave Engineering*, pp. 667-69 (Cambridge University Press, 2004).

As shown in FIG. 1, the Doherty amplifier design may be extended to an N-way amplifier 100 having N legs or amplifiers where a main (or carrier) amplifier 110 is associated with the lowest power level, a first peaking amplifier 120-1 is associated with the next highest power level, and so on until a (N−1)th peaking amplifier 120-(N−1) is associated with the highest power level. Typically, the main amplifier is a Class AB or class B amplifier and the (N−1) peaking amplifiers are Class C amplifiers (or class AB amplifiers re-biased to emulate Class C amplifiers). Also shown in FIG. 1 are an input 130, an output 140, a load 150, an N-way signal splitter 160, a plurality of input delay lines 170-1 to 170-(N−1), and a plurality of output quarter-wave (λ/4) delay lines 180-1 to 180-(N−1). The input delay lines 170-1 to 170-(N−1) introduce increasing multiples of a quarter-wave (λ/4) length delay in the signal supplied from signal splitter 160 to the peaking amplifiers beginning with a quarter-wave delay in the signal supplied to peaking amplifier 120-1, a half-wave delay in the signal supplied to peaking amplifier 120-2 and so on to a delay of (N−1)λ/4 in the signal supplied to peaking amplifier 120-(N−1). The signal delays produced by the input delay lines are matched by the signal delays produced by the output delay lines.

Unfortunately, Doherty power amplifiers are considerably non-linear and thus usually require substantial digital pre-distortion (DPD) or analog pre-distortion (APD) to correct the non-linearity. The DPD (or APD) function is typically provided by a separate DPD (or APD) circuit block (not shown) that is located upstream of input 130. The DPD (or APD) function requires additional cost and power consumption.

SUMMARY

The present invention moves some of the pre-distortion from the DPD or APD block into the Doherty amplifier by implementing a series of analog gain and phase correction circuits in each leg of the N-way Doherty to significantly reduce amplitude modulation to amplitude modulation (AM-AM) and amplitude modulation to phase modulation (AM-PM) distortion. The correction blocks comprise gain and phase corrections and optionally an additional gain block. The phase corrections include at least a phase offset and may include an optional non-linear element such as a diode pre-distorter. The pre-distortion circuitry is intended to reduce the necessary complexity of the DPD and reduce the DPD cost and power consumption.

The gain and phase corrections can be calculated from computational optimization to minimize the AM-AM and AM-PM distortion. The gain and phase corrections can also be calculated from the AM-AM and AM-PM data which can be output from common DPD systems and laboratory characterization equipment.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
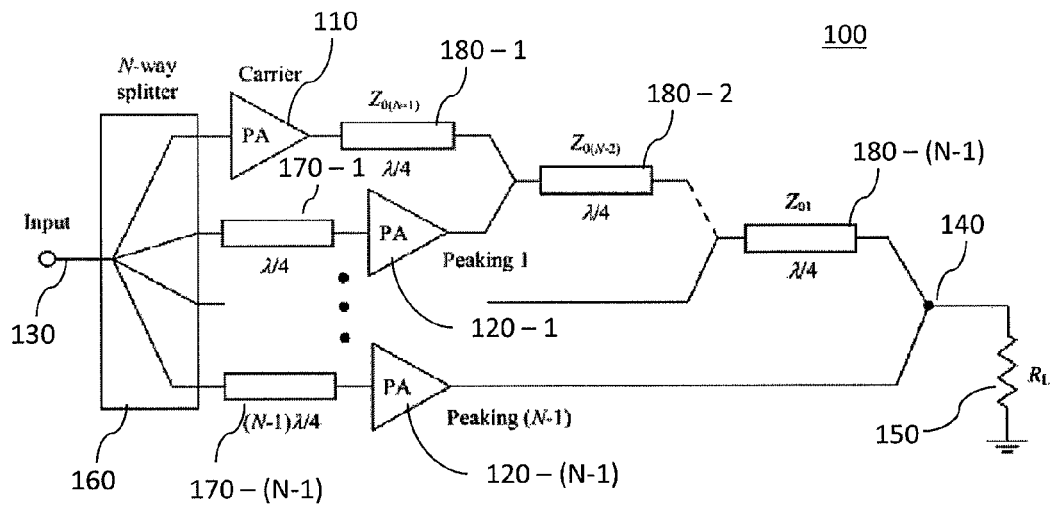
FIG. 1 is a schematic diagram of a conventional N-way Doherty power amplifier.
Figure 2:
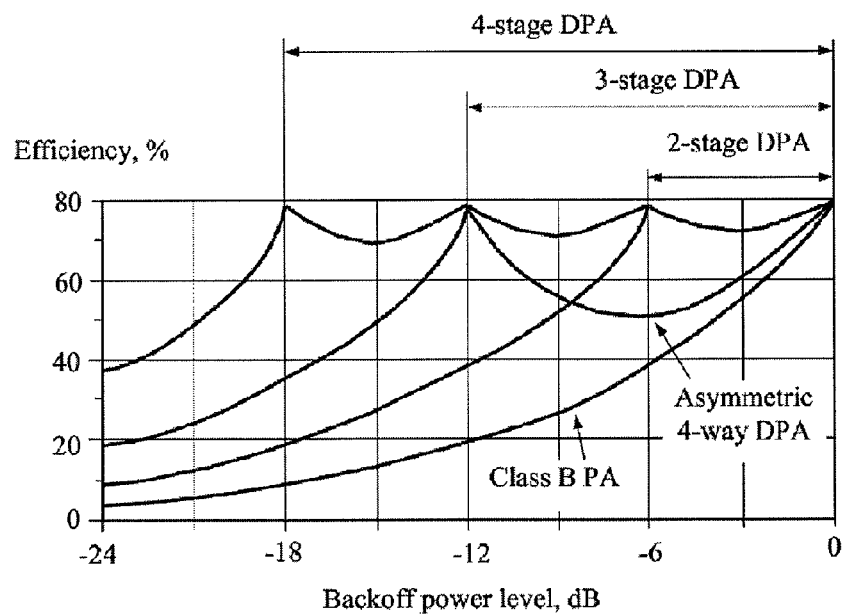
FIG. 2 is a plot depicting the efficiency of an N-way Doherty power amplifier.
Figure 3:
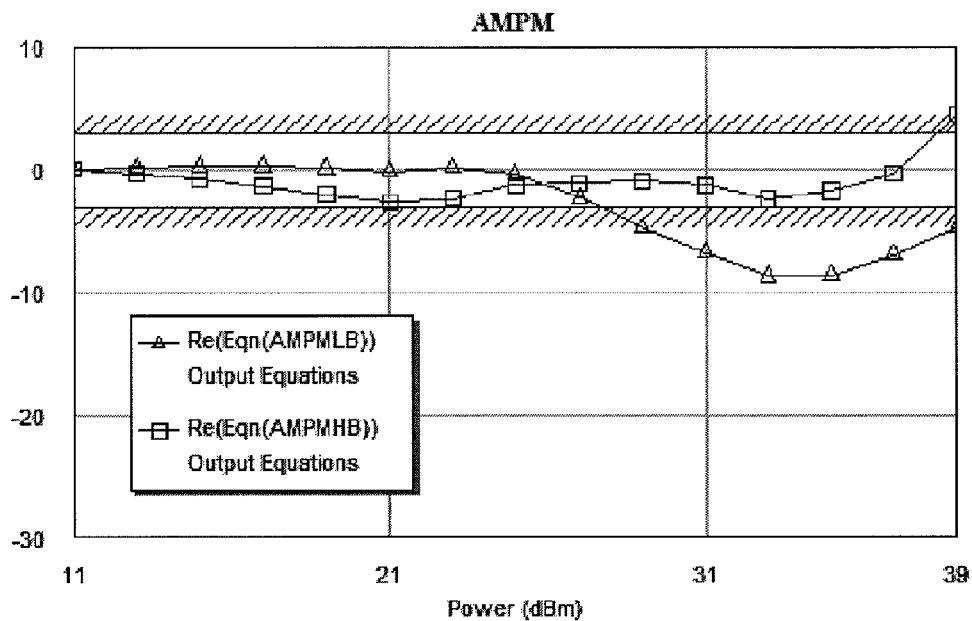
FIGS. 3-6 depicts plots of AM-PM distortion, AM-AM distortion, gain and PAE for a 2-way 1:1 GaN HEMT Doherty amplifier.

As mentioned above, FIG. 1 depicts a conventional N-way Doherty amplifier 100. This amplifier creates N efficiency peaks as shown in FIG. 2.

Figure 7:
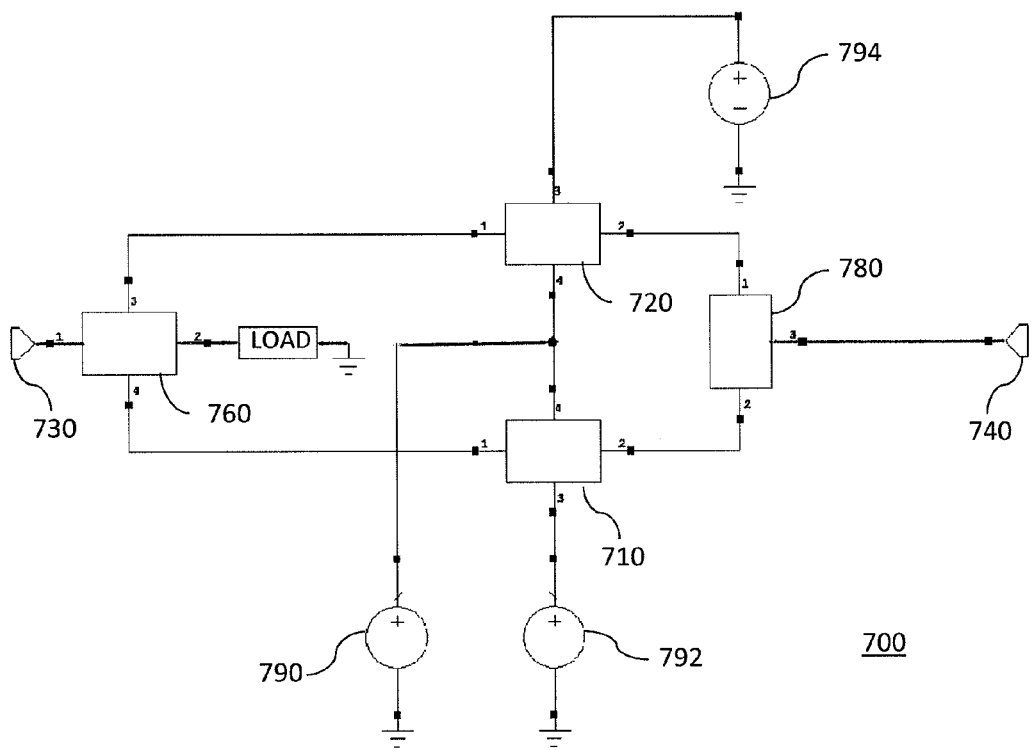
FIG. 7 is a schematic of a 2-way 1:1 GaN HEMT Doherty amplifier.
Figure 8:
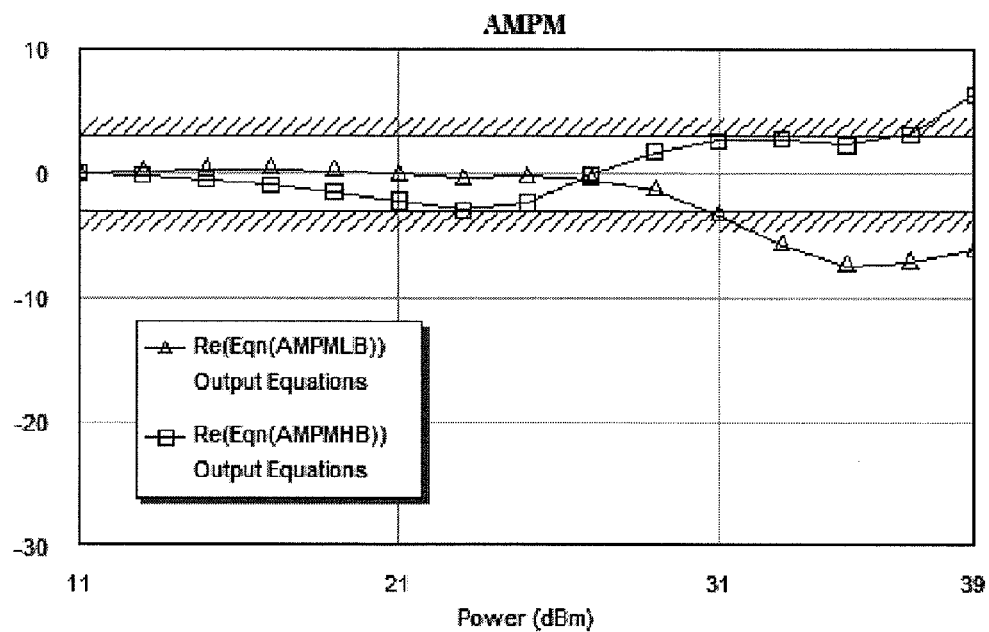
FIGS. 8-11 depict plots of AM-PM distortion, AM-AM distortion, gain and PAE for a 3-way 1:1:1 GaN HEMT Doherty amplifier.

FIGS. 3-6 depict the amplitude modulation to phase modulation (AM-PM), amplitude modulation to amplitude modulation (AM-AM), gain and PAE of an actual 2-way implementation of a Doherty amplifier, specifically a symmetrical (1:1) 16 W Peak/2 W Average GaN HEMT Doherty amplifier 700 shown in FIG. 7. Such an amplifier might be used in a small cell for cellular infrastructure.

Amplifier 700 comprises a main or carrier amplifier 710, a peaking amplifier 720, an input 730, an output 740, a signal splitter 760, a signal combiner 780 and voltage supplies 790, 792, and 794. The signal splitter splits a signal received at input 730 into a component that is supplied to main amplifier 710 and a component that is supplied to peaking amplifier 720 and introduces a quarter-wave ($\lambda/4$) delay in the signal supplied to peaking amplifier 720. Signal combiner 780 delays the output from main amplifier 710 by a quarter-wave, combines the output from main amplifier 710 with any output from peaking amplifier 720 and provides the combined signal to output 740. Voltage supplies 790 and 792 supply power to main amplifier 710 and voltage supplies 790 and 794 supply power to peaking amplifier 720. Illustratively, voltage supply 790 is a 28 Volt supply; voltage supply 792 is a −3 Volt supply; and voltage supply 794 is a −5 volt supply.

Figure 12:
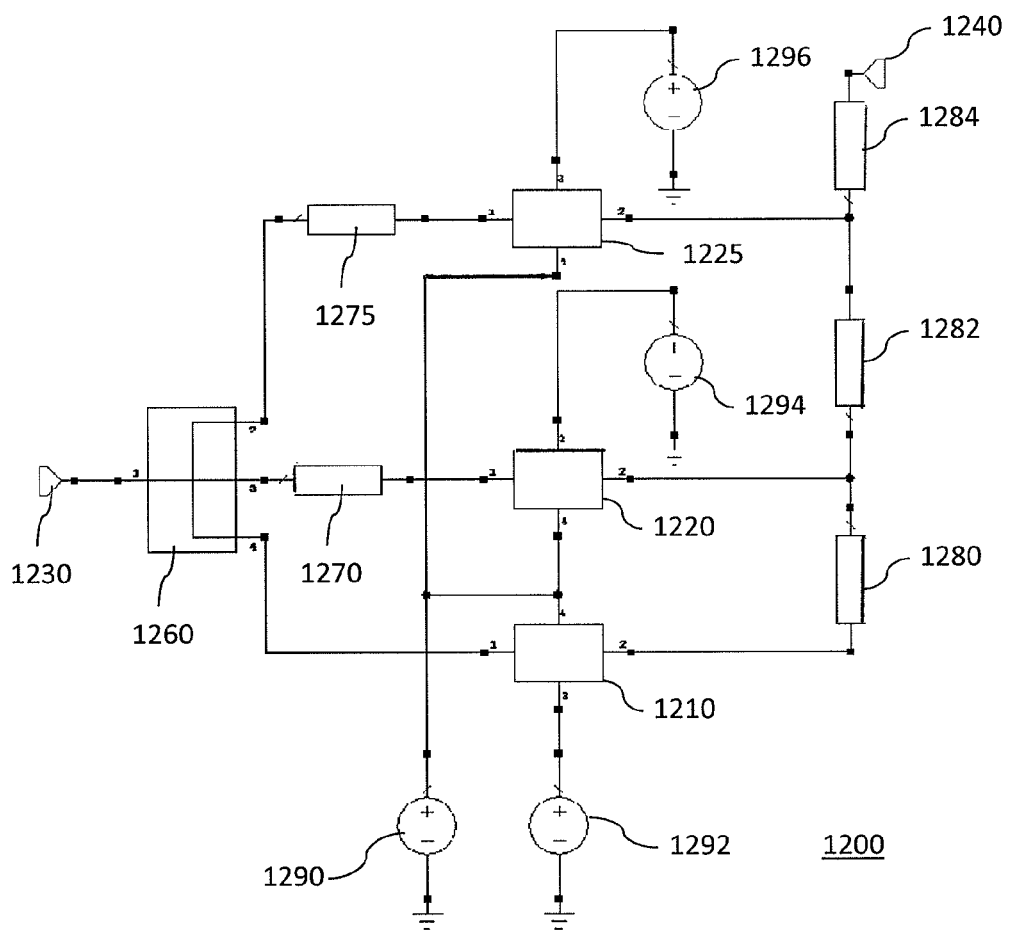
FIG. 12 is a schematic of a 3-way 1:1:1 GaN HEMT Doherty amplifier.

FIGS. 8-11 depict the AM-AM, AM-PM, gain and PAE of an actual 3-way implementation of a Doherty amplifier, specifically a symmetrical (1:1:1) 24 W Peak/3 W Average GaN HEMT Doherty amplifier 1200 shown in FIG. 12. Such an amplifier might also be used in a cellular network femto-cell or small-cell base station.

Amplifier 1200 comprises a main or carrier amplifier 1210, first and second peaking amplifiers 1220 and 1225, an input 1230, an output 1240, a signal splitter 1260, first and second input delay lines 1270, 1275, first, second and third output delay lines 1280, 1282, 1284, and voltage supplies 1290, 1292, 1294, and 1296. The signal splitter splits a signal received at input 1230 into components that are supplied to main amplifier 1210 and to delay lines 1270 and 1275. Delay line 1270 delays the signal it receives from splitter 1260 by a quarter-wave and provides it to first peaking amplifier 1220. Delay line 1275 delays the signal provided to it from splitter 1260 by a half wave and supplies it to second peaking amplifier 1225. Output delay line 1280 delays the output of amplifier 1210 by a quarter-wave and provides the delayed signal to output delay line 1282. Output delay line 1282 combines the signal from output delay line 1280 with the output of first peaking amplifier 1220, delays the combined signal by another quarter wave and provides it to third output delay line 1284. Output delay line 1284 combines the signal received from second output delay line 1282 with the output of second peaking amplifier 1225, delays the combined signal by a quarter wave and provides the delayed signal to output 1240. Voltage supplies 1290 and 1292 supply power to main amplifier 1210 voltage supplies 1290 and 1294 supply power to peaking amplifier 1220; and voltage supplies 1290 and 1296 supply power to peaking amplifier 1225. Illustratively, voltage supply 1290 is a 28 Volt supply; voltage supply 1292 is a −3 Volt supply; and voltage supplies 1294 and 1296 are −5 Volt supplies.

In the prior art, the non-linearity of the Doherty is corrected externally, usually by way of a Digital Pre-Distortion system (DPD) or Analog Pre-Distortion system (APD) located upstream of input 130. One simplistic form of DPD involves a look up table (LUT) which is a function of signal power and contains corrections to gain and phase necessary to pre-compensate (pre-distort) the input signal to the power amplifier to reduce the resulting output signal distortion to an acceptable level. Traditionally this approach has been acceptable for large Doherty power amplifiers where the cost (including power consumption) of the DPD is small enough relative to the high cost of a large amplifier and the associated high power consumption of the large amplifier. Recently, the interest in applying Doherty power amplifiers to lower power levels has increased the interest in reducing the DPD (or APD) cost (including power consumption and complexity). However, unless the pre-distortion cost is reduced, it is not practical to apply the DPD and Doherty approach to lower power levels as the DPD cost and power consumption outweigh the benefit.

Figure 13:
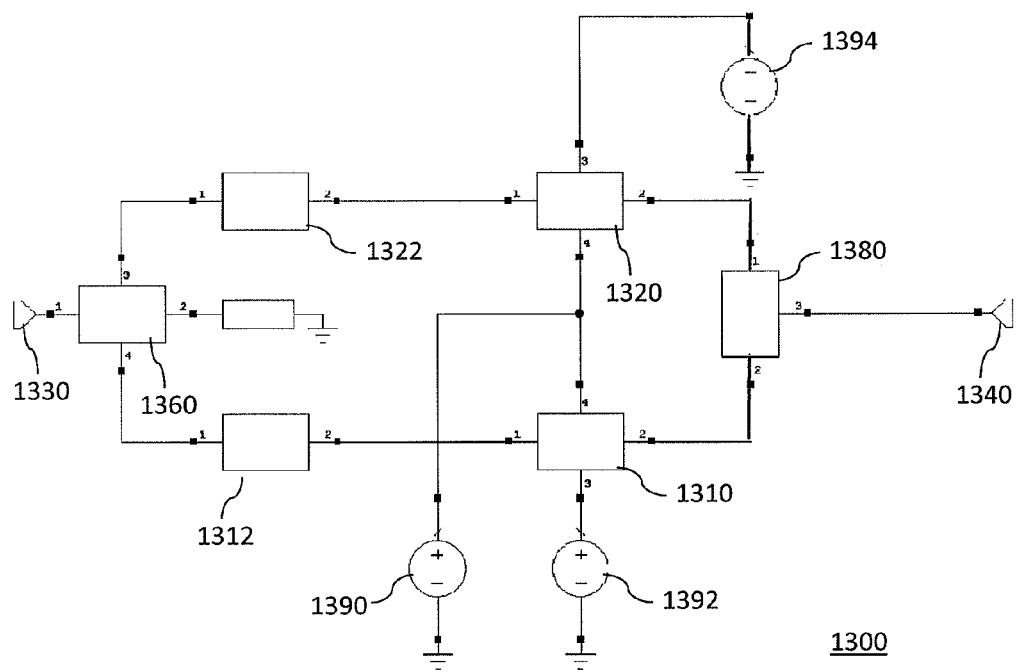
FIG. 13 is a schematic of a 2-way 1:1 GaN HEMT Doherty amplifier with integrated pre-distortion.
Figure 14:
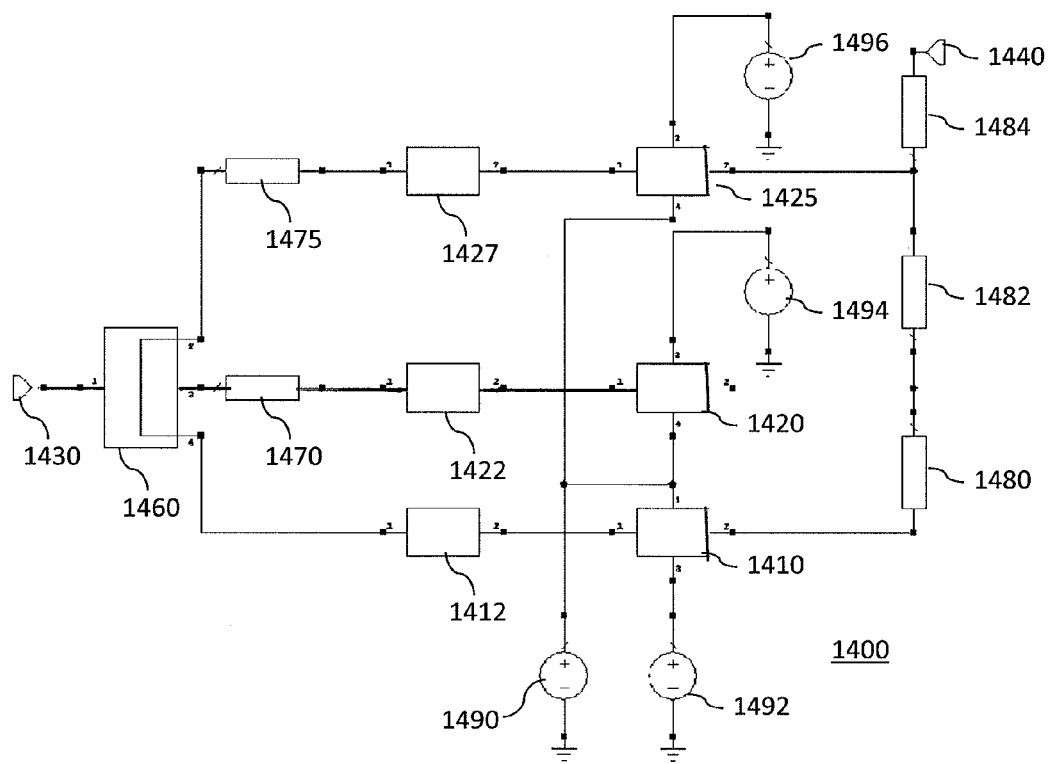
FIG. 14 is a schematic of a 3-way 1:1:1 GaN HEMT Doherty amplifier with integrated pre-distortion.

FIGS. 13 and 14 depict the present invention applied to the previously shown 2-Way and 3-Way GaN HEMT Doherty implementations of FIGS. 7 and 12.

In FIG. 13, an amplifier 1300 comprises a main or carrier amplifier 1310, a predistortion circuit 1312 for the main amplifier, a peaking amplifier 1320, a predistortion circuit 1322 for the peaking amplifier, an input 1330, an output 1340, a signal splitter 1360, a signal combiner 1380 and voltage supplies 1390, 1392, and 1394. The signal splitter splits a signal received at input 1330 into a component that is supplied to predistortion circuit 1312 and main amplifier 1310 and a component that is supplied to predistortion circuit 1322 and peaking amplifier 1320 and introduces a quarter-wave ($\lambda/4$) delay in the signal supplied to predistortion circuit 1322 and peaking amplifier 1320. The predistortion circuits implement gain and phase corrections in the input signals as described more fully below. Signal combiner 1380 delays the output from main amplifier 1310 by a quarter-wave, combines the output from main amplifier 1310 with any output from peaking amplifier 1320 and provides the combined signal to output 1340.

In FIG. 14, an amplifier 1400 comprises a main or carrier amplifier 1410, a predistortion circuit 1412 for the main amplifier, first and second peaking amplifiers 1420 and 1425, first and second predistortion circuits 1422, 1427 for the first and second peaking amplifiers, an input 1430, an output 1440, a signal splitter 1460, first and second input delay lines 1470, 1475, first, second and third output delay lines 1480, 1482, 1484, and voltage supplies 1490, 1492, 1494, and 1496. The signal splitter splits a signal received at input 1430 into components that are supplied to predistortion circuit 1412 of main amplifier 1410 and to delay lines 1430 and 1435. Delay line 1430 delays the signal it receives from splitter 1460 by a quarter-wave and provides it to distortion circuit 1422 of first peaking amplifier 1420. Delay line 1460 delays the signal provided to it from splitter 1460 by a half wave and supplies it to distortion circuit 1427 of second peaking amplifier 1425. Distortion circuits 1412, 1422 and 1427 implement gain and phase corrections in the input signals they receive.

Output delay line 1480 delays the output of amplifier 1410 by a quarter-wave and provides the delayed signal to output delay line 1482. Output delay line 1482 combines the signal from output delay line 1480 with the output of first peaking amplifier 1420, delays the combined signal by another quarter wave and provides it to third output delay line 1484. Output delay line 1484 combines the signal received from second output delay line 1482 with the output of second peaking amplifier 1425, delays the combined signal by a quarter wave and provides the delayed signal to output 1440.

Figure 4:
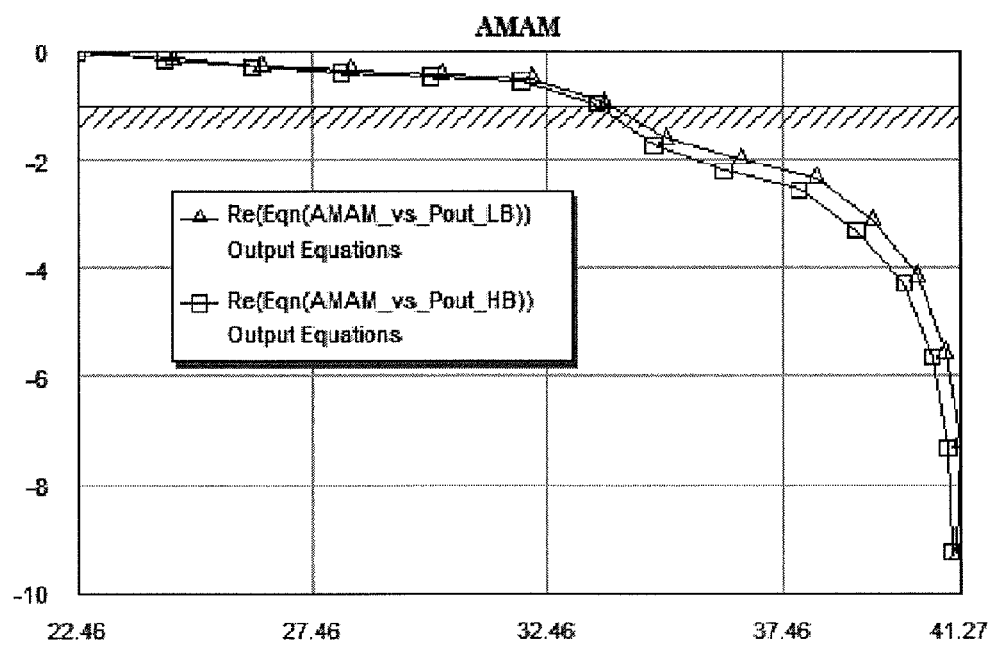
Figure 5:
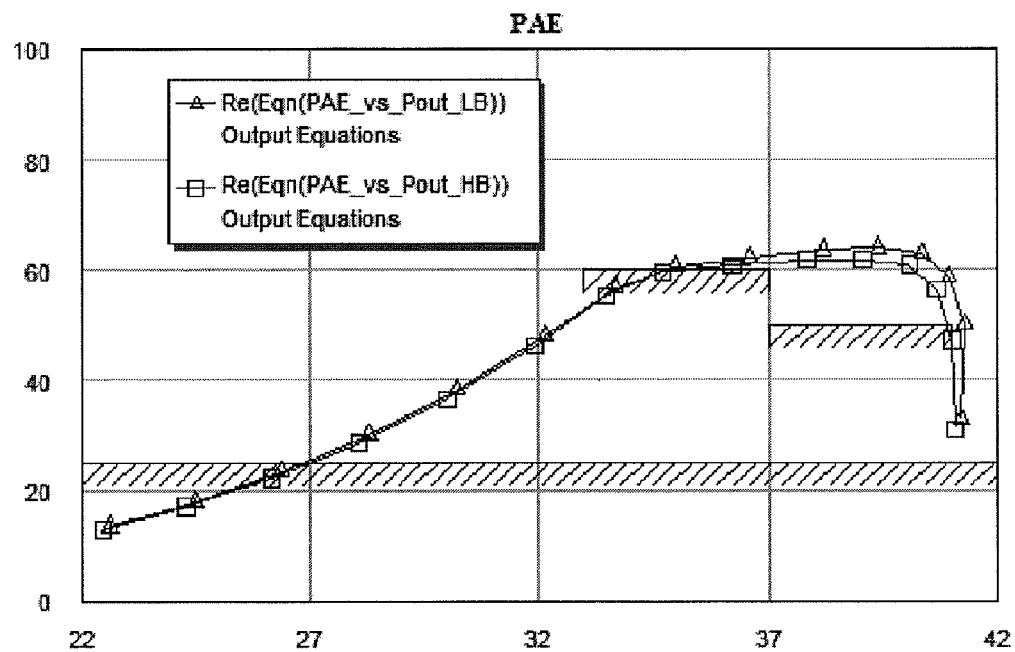
Figure 6:
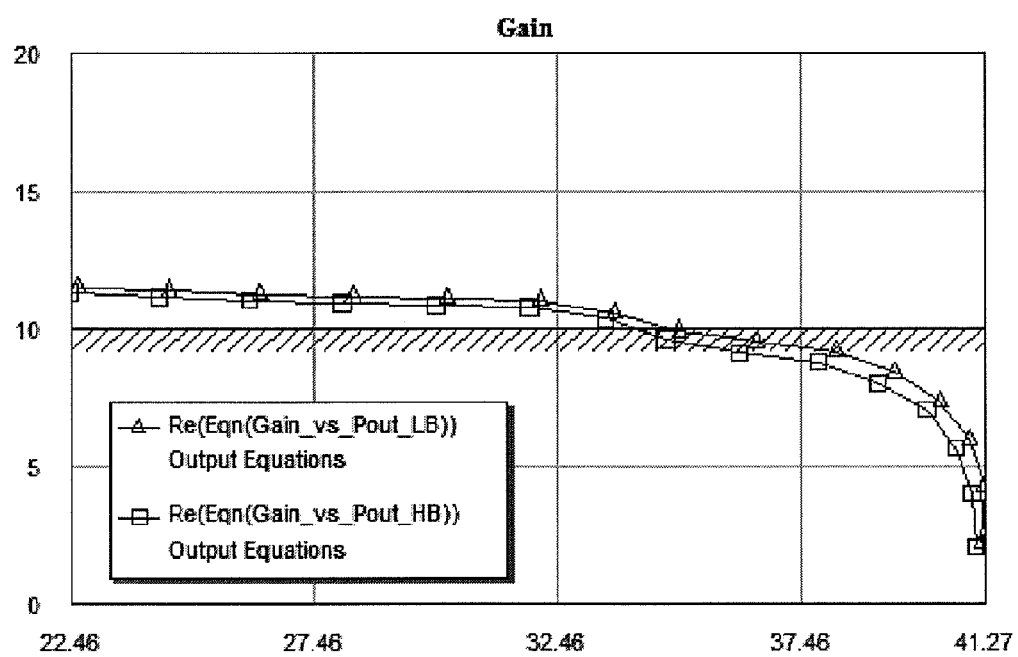
Figure 9:
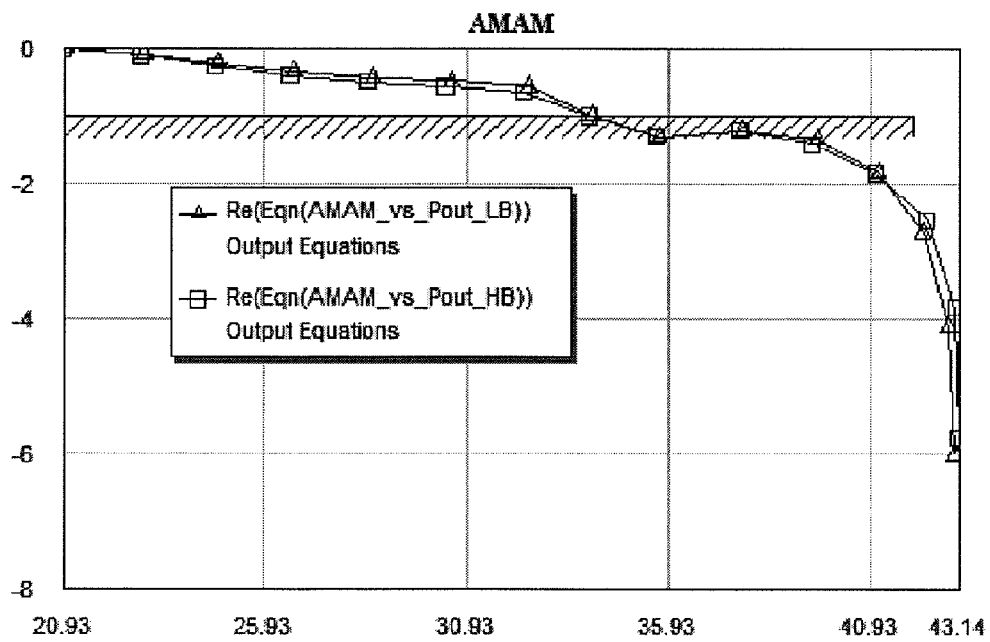
Figure 10:
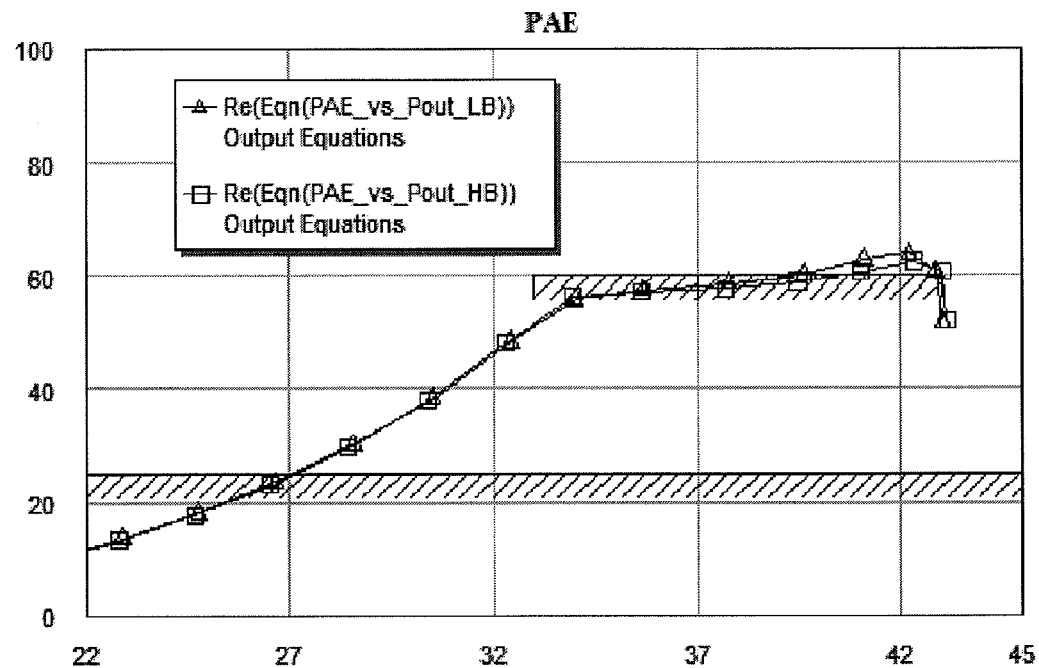
Figure 11:
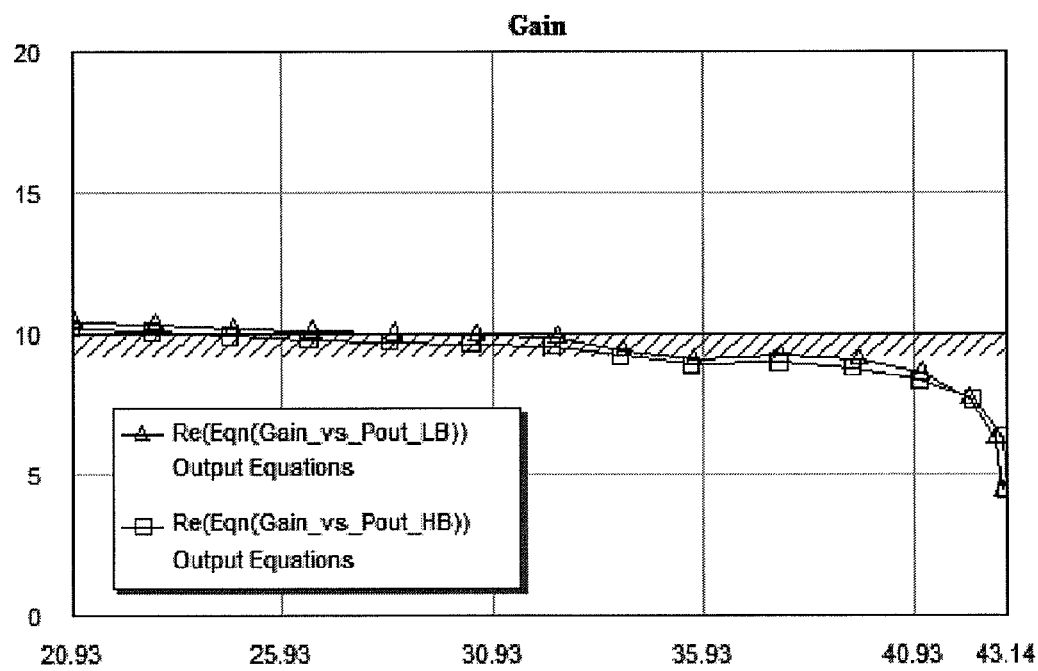
Figure 15:
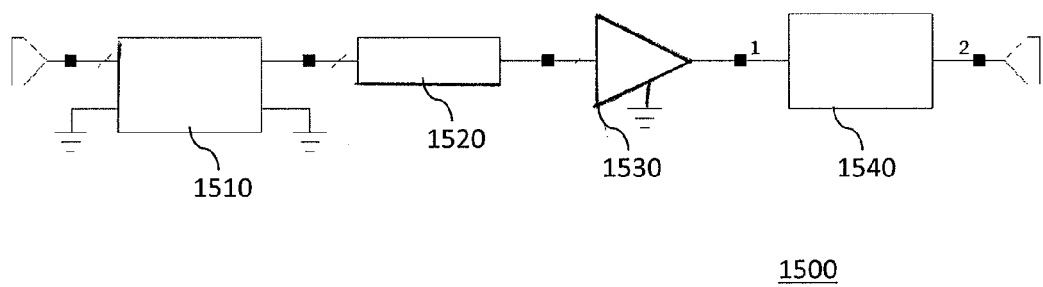
FIG. 15 is a block diagram of an integrated pre-distortion block.

An illustrative embodiment of a predistortion circuit such as circuits 1312, 1322, 1412, 1422, 1427 is shown in detail in FIG. 15. The predistorter circuit contains a gain adjustment (attenuator) 1510 to adjust for AM-AM humps such as shown in FIGS. 4 and 9. Next the predistorter circuit contains a fixed phase offset 1520 and finally an optional gain stage 1530 and diode pre-distorter 1540. The optional gain stage is desirable with the present invention as otherwise the use of an attenuator for AM-AM correction would significantly reduce PAE.

Each predistortion circuit implements the gain and phase corrections in the form of a hardware gain and phase correction in front of the amplifier associated with that power level. In a conventional Doherty amplifier the power added efficiency (PAE) penalty from the large AM-AM correction for main amplifier is not attractive. Hence, the corrections are done at lower power levels in the present invention through the inclusion of the pre drivers in each gain block. In preferred implementations the pre driver gain is high enough that the gain corrections have no significant impact on the PAE. Finally FIG. 15 contains a non-linear pre-distorter (such as a simple diode pre-distorter) to improve the linearity of each amplifier (such as by increasing the compression point and reducing AM-PM).

In practical implementations it is expected that computational optimization combined with characterization data will be used to optimize the N basic gain and N basic phase corrections for the N amplifiers in an N-way Doherty amplifier. It is expected that the diode pre-distorter will be designed/characterized on the main amplifier alone and copied to the peaking amplifiers (re-biased) in the simplest implementations.

Figure 16:
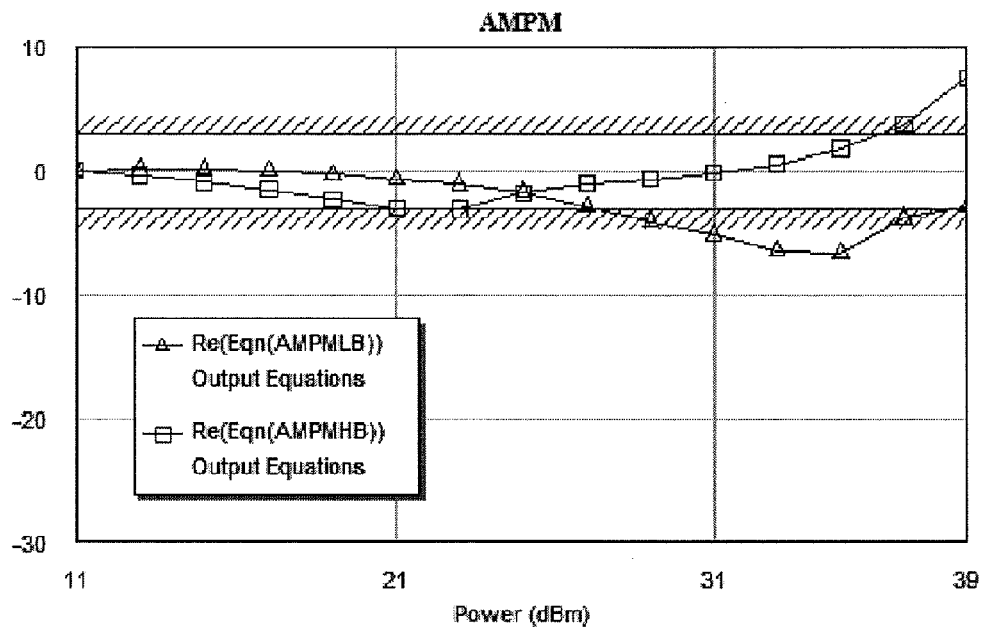
FIGS. 16-19 depict plots of AM-PM distortion, AM-AM distortion, gain and PAE for the improved 2-way 1:1 GaN HEMT Doherty amplifier of FIG. 13.
Figure 17:
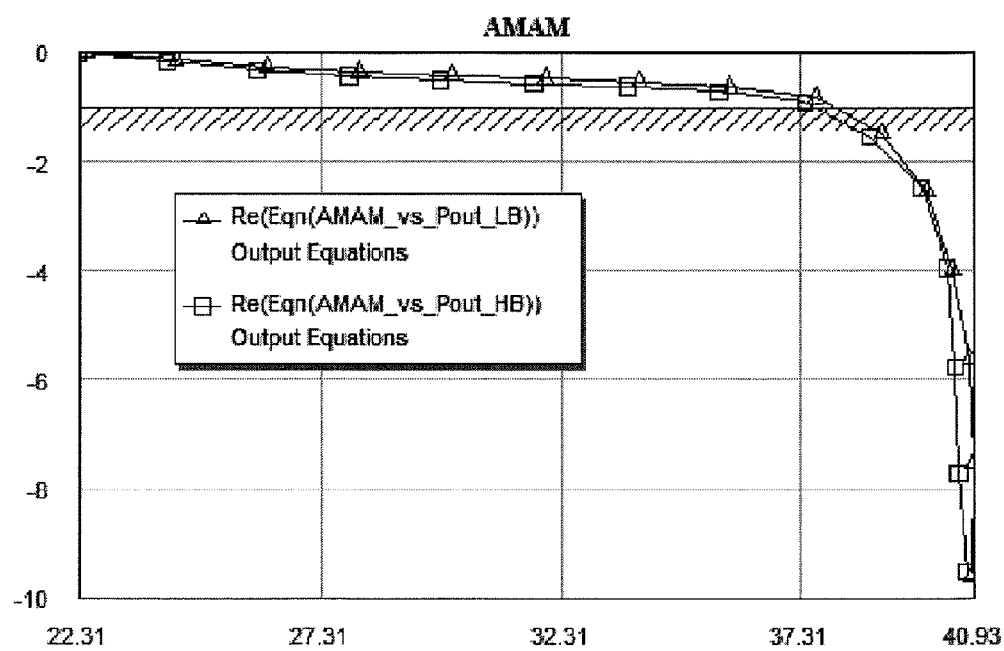
Figure 18:
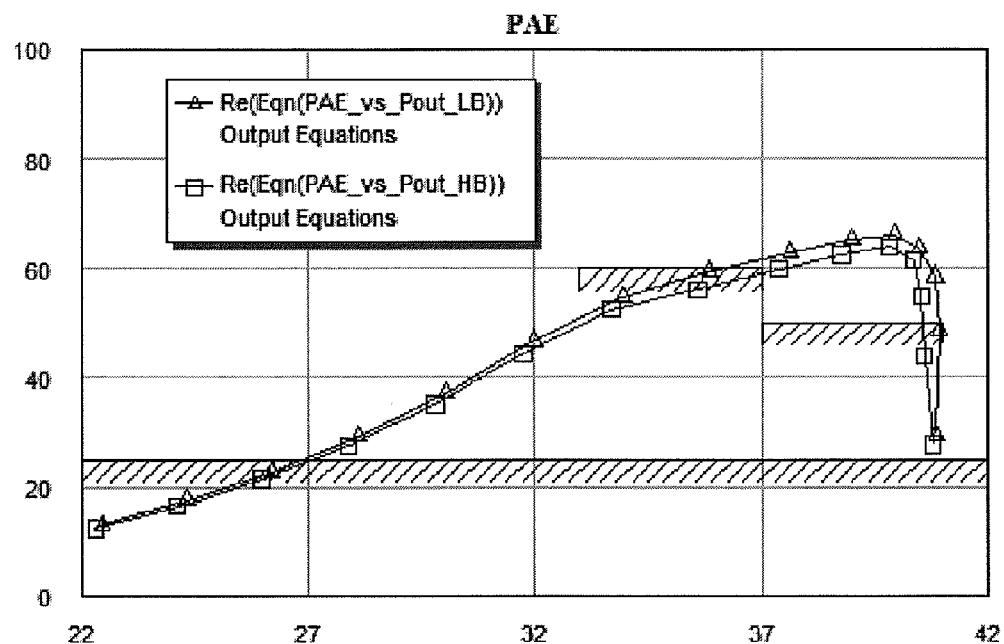
Figure 19:
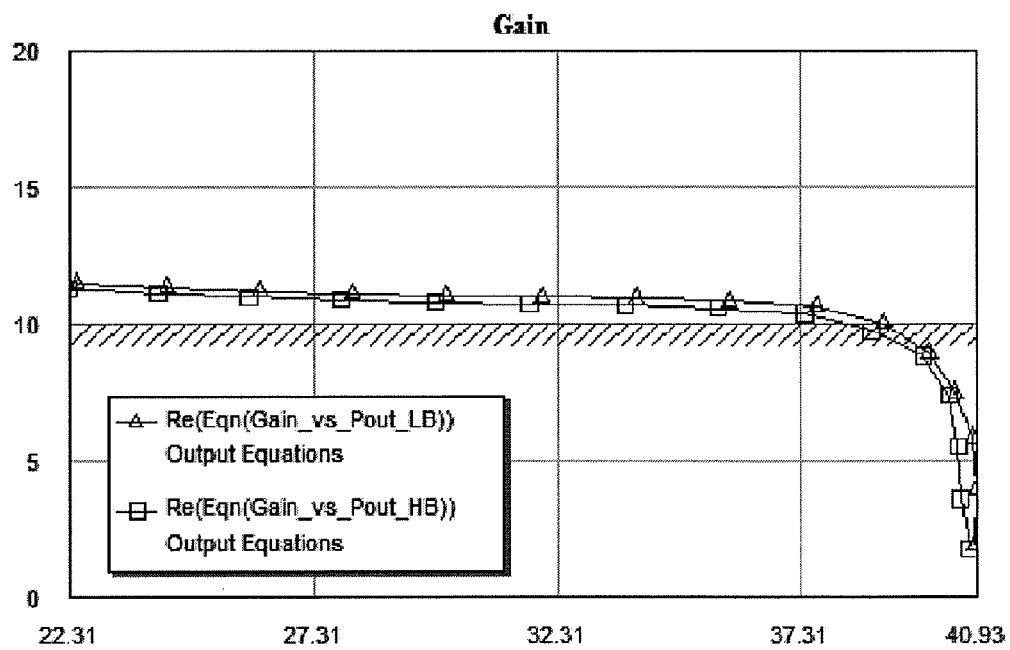

FIGS. 16-19 show the significantly improved simulation results for the 2-Way 1:1 GaN HEMT Doherty with integrated pre-distortion. Notably, the AM-AM characteristic depicted in FIG. 17 is now very flat.

Figure 20:
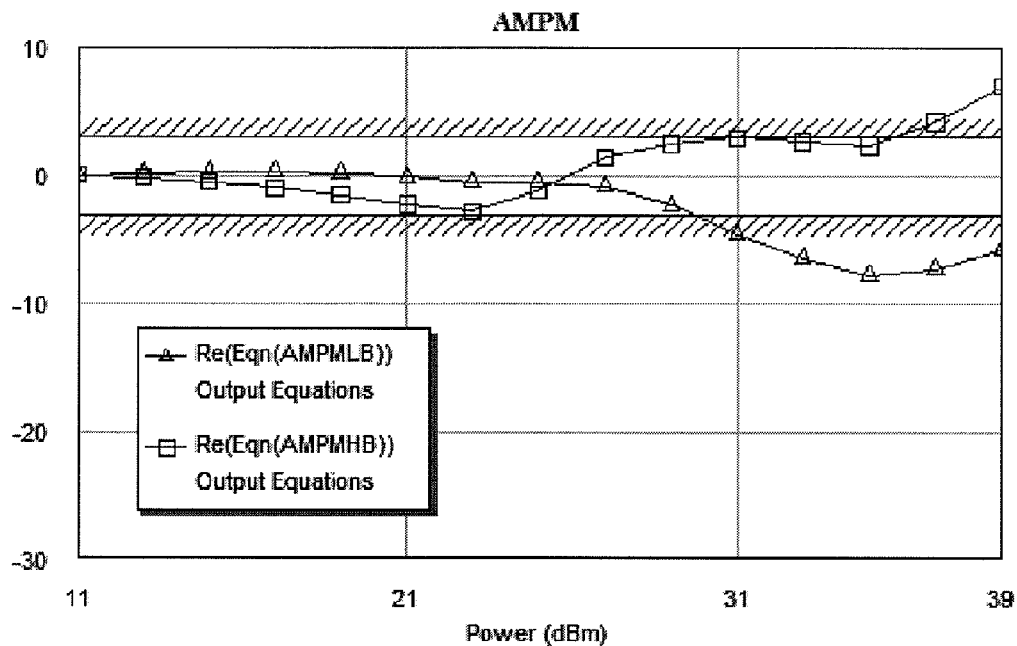
FIGS. 20-23 depict plots of AM-AM distortion, AM-PM distortion, gain and PAE for the improved 3-way 1:1:1 GaN HEMT Doherty amplifier of FIG. 14.
Figure 21:
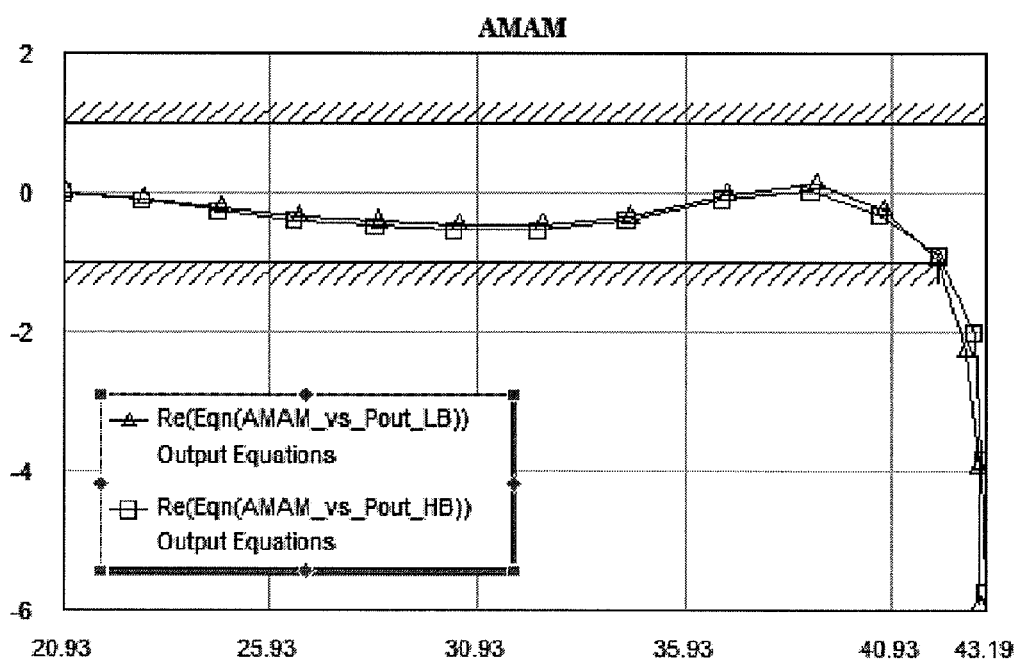
Figure 22:
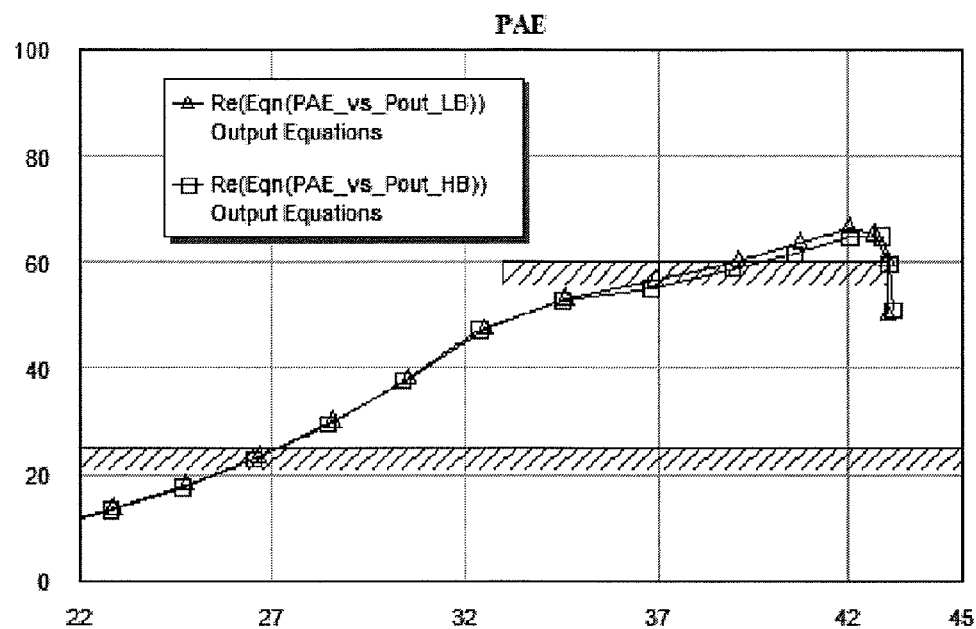
Figure 23:
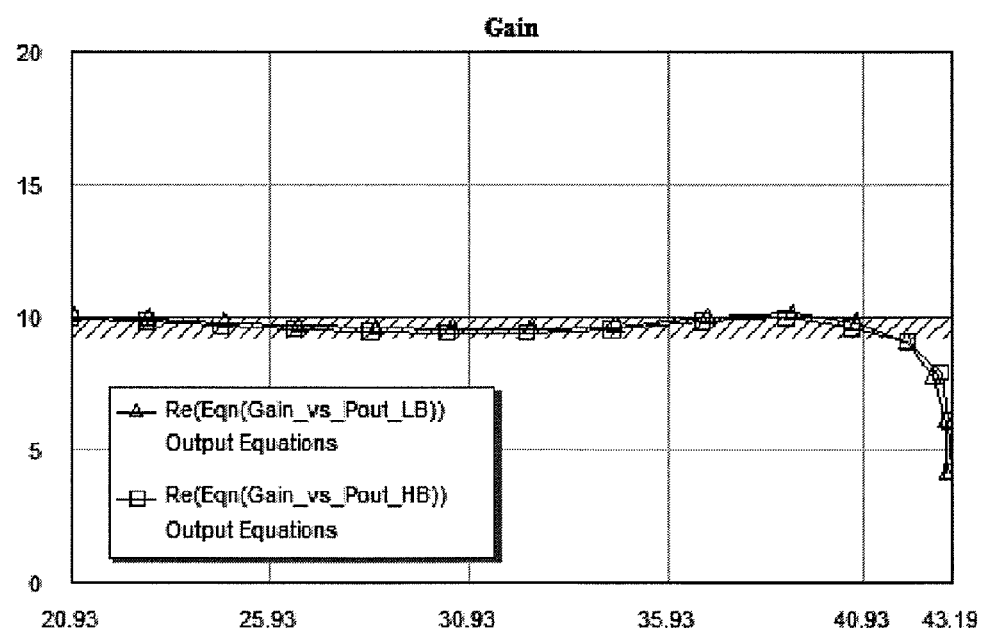

FIGS. 20-23 show the significantly improved simulation results for the 3-Way 1:1:1 GaN HEMT Doherty with integrated pre-distortion. Again, the AM-AM characteristic depicted in FIG. 21 is now very flat. The large reduction in AM-AM distortion will reduce the necessary DPD or APD correction. Note that for these examples the AM-PM depicted in FIGS. 16 and 20 is already fairly flat and is limited by variation across the band. The degree of improvement is expected to increase with N.

In certain preferred methods of implementation, the main and peaking amplifiers (with the integrated pre-distortion) are matched in gain and phase due to monolithic construction. In some preferred methods of implementation, the monolithically constructed N (main and peaking) amplifiers are then mechanically separated (by saw, laser, etc) while maintaining strict gain and phase matching. The gain and phase matching is important so that manufacturing variation does not result in gain and phase variation that is significant compared to the attempted gain and phase corrections. The proposed invention is not very practical when applied directly to the prior art due to the lack of sufficient gain and phase matching and the lack of sufficient gain in each amplifier stage.

In alternative and more advanced implementations, the gain and phase correction is implemented with variable gain and phase elements such as digitally controlled variable gain amplifiers and phase shifters. The controls for the gain and phase might be static such as from programmed non-volatile memory (a few bits for each of the N amplifiers) or could be dynamically programmed through a digital interface. The control bits could be obtained from a LUT that is a function of other variables such as temperature, frequency, etc. Alternatively, the control bits could be obtained from a latch updated by a microprocessor to provide dynamic DPD-like correction.

The invention may be practiced with positive or negative phase correction Pi or T networks such as at cellular frequencies, or phase offset transmission lines at higher frequencies.

The invention may also be practiced with 3 dB hybrids as opposed to in-phase splitters and phase shift lines at certain frequencies and then branch line and Lange couplers at point to point/microwave frequencies.

As will be apparent to those skilled in the art, numerous variations may be practiced within the spirit and scope of the present invention.

What is claimed is:

1. An N-way Doherty amplifier comprising:
   a main amplifier;
   (N-1) peaking amplifiers where N is equal to or greater than 2; and
   individual pre-distortion circuits monolithically integrated into the main amplifier and into each peaking amplifier to reduce amplitude modulation to amplitude modulation (AM-AM) distortion and amplitude modulation to phase modulation (AM-PM) distortion in the amplifiers in which they are integrated.

2. The amplifier of claim 1 wherein each pre-distortion circuit is implemented with a variable element such as a digitally controlled variable gain amplifier or digitally controlled phase shifter.

3. The amplifier of claim 1 wherein each pre-distortion circuit is implemented with gain and phase circuits.

4. The amplifier of claim 3 wherein controls for the gain and phase circuits are static.

5. The amplifier of claim 3 wherein controls for the gain and phase circuits are programmed dynamically through a digital interface.

6. The amplifier of claim 3 wherein controls for the gain and phase circuits are obtained from a look up table (LUT) that is a function of other variables such as temperature, frequency, etc.

7. The amplifier of claim 1 wherein the main amplifier is a linear amplifier.

8. The amplifier of claim 7 wherein the linear main amplifier is a distortion cancelling class AB power amplifier.

9. The amplifier of claim 8 wherein one or more of the peaking amplifiers are linear amplifiers.

10. The amplifier of claim 9 wherein the linear peaking amplifiers are distortion cancelling class AB power amplifiers re-biased to emulate Class-C amplifiers by introducing very strong gain expansion.

11. The amplifier of claim 1 wherein one or more of the peaking amplifiers are linear amplifiers.

12. The amplifier of claim 11 wherein the linear peaking amplifiers are distortion cancelling class AB power amplifiers re-biased to emulate Class-C amplifiers by introducing very strong gain expansion.

13. The amplifier of claim 1 wherein the pre-distortion circuit integrated into the main amplifier and into each peaking amplifier comprises an attenuator to adjust for AM-AM humps and a fixed phase offset.

14. The amplifier of claim 13 wherein the pre-distortion circuit also comprises a diode pre-distorter.

15. The amplifier of claim 13 wherein the pre-distortion circuit also comprises a gain stage.

16. A Doherty amplifier comprising a plurality of power amplifiers with a different pre-distortion circuit block monolithically integrated into each of the power amplifiers to reduce amplitude modulation to amplitude modulation (AM-AM) distortion and amplitude modulation to phase modulation (AM-PM) in the power amplifier in which it is integrated.

17. An N-way Doherty amplifier comprising
a signal splitter for splitting an input signal into N signals and for delaying (N−1) of the N signals by different amounts;
N power amplifiers for amplifying the N signals from the signal splitter;
a different pre-distortion circuit monolithically integrated into each of the N power amplifiers to reduce amplitude modulation to amplitude modulation (AM-AM) distortion and amplitude modulation to phase modulation (AM-PM) distortion in the power amplifier in which it is integrated; and
a signal combiner for producing an output signal by combining an output from each of the N power amplifiers after outputs from (N−1) of the amplifiers are delayed by different amounts.

18. The Doherty amplifier of claim 17 where the signal splitter delays (N−1) of the N signals by different integral numbers of a quarter wavelength of the input signal.

19. The Doherty amplifier of claim 17 where the signal combiner delays (N−1) of the N signals by different integral numbers of a quarter wavelength of the input signal.

20. The Doherty amplifier of claim 17 wherein each pre-distortion circuit is implemented with gain and phase circuits.

* * * * *